US012695444B2

(12) United States Patent
Li et al.

(10) Patent No.: US 12,695,444 B2
(45) Date of Patent: Jul. 28, 2026

(54) 2-BIT HIGH-POWER AMPLIFYING NON-RECIPROCAL REFLECTIVE METASURFACE

(71) Applicant: Xidian University, Xi'an (CN)

(72) Inventors: Long Li, Xi'an (CN); Guanxuan Li, Xi'an (CN); Xin Wang, Xi'an (CN); Dexiao Xia, Xi'an (CN); Ruijie Li, Xi'an (CN); Haixia Liu, Xi'an (CN)

(73) Assignee: Xidian University, Xi'an (CN)

( * ) Notice: Subject to any disclaimer, the term of this patent is extended or adjusted under 35 U.S.C. 154(b) by 432 days.

(21) Appl. No.: 18/404,899

(22) Filed: Jan. 5, 2024

(65) Prior Publication Data

US 2024/0235537 A1     Jul. 11, 2024

(30) Foreign Application Priority Data

Jan. 9, 2023     (CN) .......................... 202310036368.2

(51) Int. Cl.
| | |
|---|---|
| *H03K 5/02* | (2006.01) |
| *H01P 1/00* | (2006.01) |
| *H01P 1/16* | (2006.01) |
| *H01P 1/185* | (2006.01) |

(52) U.S. Cl.
CPC .............. H03K 5/02 (2013.01); H01P 1/005 (2013.01); H01P 1/16 (2013.01); H01P 1/185 (2013.01)

(58) Field of Classification Search
CPC .......... H03K 5/02; H03K 3/037; H03K 19/18; H01P 1/16; H01P 1/005
USPC ......................................................... 359/333
See application file for complete search history.

(56) References Cited

U.S. PATENT DOCUMENTS

| | | | | |
|---|---|---|---|---|
| 7,307,589 | B1 * | 12/2007 | Gregoire | ................ H01Q 1/248 |
| | | | | 343/700 MS |
| 9,742,462 | B2 * | 8/2017 | Bennett | ................ H02J 13/1323 |
| 10,069,185 | B2 * | 9/2018 | Henry | ..................... H01P 3/127 |
| 10,335,367 | B2 * | 7/2019 | Bodor | ..................... A61K 31/40 |
| 11,715,888 | B1 * | 8/2023 | Huang | ..................... H01Q 3/44 |
| | | | | 343/702 |
| 2020/0274245 | A1 * | 8/2020 | Shrekenhamer | ... H01Q 15/0086 |
| 2022/0399651 | A1 * | 12/2022 | Sleasman | ............. H01Q 3/2658 |

* cited by examiner

*Primary Examiner* — Daniel St Cyr
(74) *Attorney, Agent, or Firm* — Nitin Kaushik

(57) ABSTRACT

A 2-bit high-power amplifying non-reciprocal reflective metasurface is provided. The metasurface comprises a plurality of metasurface units distributed in an array; each metasurface unit comprises a first metal layer, an intermediate layer, and a second metal layer which are sequentially stacked; the second metal layer comprises a receiving metal patch and a transmitting metal patch; two diodes are both positioned on a longitudinal central axis of the receiving metal patch; orientation of the slot on the transmitting metal patch is orthogonal to orientation of the slot on the receiving metal patch; the first metal layer comprises a phase shifter, which comprises first series diodes and second series diodes forming a reconfigurable 90-degree phase-shift circuit.

10 Claims, 10 Drawing Sheets

1032

103

1031

101

1012

1011

2-BIT HIGH-POWER AMPLIFYING NON-RECIPROCAL REFLECTIVE METASURFACE

CROSS-REFERENCE TO THE RELATED APPLICATIONS

This application is based upon and claims priority to Chinese Patent Application No. 202310036368.2, filed on Jan. 9, 2023, the entire contents of which are incorporated herein by reference.

TECHNICAL FIELD

Embodiments of the present application relate to the technical field of communication, and in particular to a 2-bit high-power amplifying non-reciprocal reflective metasurface.

BACKGROUND

Digital coding metasurfaces are a recent development in artificial electromagnetic structures that have attracted global attention among researchers. Compared to analog metasurfaces (two-dimensional metamaterials), digital coding metasurfaces allow for digital quantization and manipulation of electromagnetic waves, thereby achieving notable physical properties like beam forming and control, orbital angular momentum beam generation, Doppler stealth, and reduced radar sectional area, among others. Digital coding metasurfaces typically integrate electronically controlled lumped elements, such as switching diodes (PINs), varactors, or micro-electro-mechanical system (MEMS) switches, to manipulate parameters like amplitude, phase, and polarization of electromagnetic waves. Due to the integration of these lossy electronic elements, conventional digital coding metasurface units often can only regulate and control electromagnetic energy by attenuation. This significantly reduces system efficiency, and the power tolerance issues caused by the lossy elements restrict the application of metasurfaces in wireless communication scenarios.

Research on power-amplifying metasurface units with energy-enhancement properties holds significant practical value. Existing power-amplifying metasurface unit structures, on the one hand, achieve transmissive non-reciprocal electromagnetic wave transmission by cascading receiving and transmitting patches with amplifiers and achieve controllable gain by adjusting bias voltages. On the other hand, by designing patch units with two orthogonal hourglass-shaped coupling slots, these units realize reflective non-reciprocal amplification for orthogonal polarization waves within a relatively wide frequency range. However, current power-amplifying metasurface units, whether transmissive or reflective, are unable to simultaneously amplify electromagnetic energy while achieving stable regulation and control of electromagnetic wave phases.

SUMMARY

A 2-bit high-power amplifying non-reciprocal reflective metasurface is provided according to the embodiments of the present application, which ensures stable gain amplification properties while enabling stable phase modulation.

To address the technical issues mentioned above, a 2-bit high-power amplifying non-reciprocal reflective metasurface is provided according to the embodiments of the present application, comprising a plurality of metasurface units distributed in an array, wherein each of the metasurface units comprises a first metal layer, an intermediate layer, and a second metal layer which are sequentially stacked, wherein the second metal layer comprises a receiving metal patch and a transmitting metal patch; two diodes are disposed on the receiving metal patch, and the two diodes are both positioned on a longitudinal central axis of the receiving metal patch; slots are formed on both the transmitting metal patch and the receiving metal patch, and orientation of the slot on the transmitting metal patch is orthogonal to orientation of the slot on the receiving metal patch; the first metal layer comprises a phase shifter, which comprises first series diodes and second series diodes; the first series diodes and the second series diodes each comprise two diodes in series, and the first series diodes are connected in parallel at both ends of the second series diodes; the first series diodes and the second series diodes form a reconfigurable 90-degree phase-shift circuit; by adjustment of states of the diodes on the receiving metal patch and states of the first series diodes and the second series diodes in the phase shifter, electromagnetic wave phase achieves 2 bits, i.e., allowing for four independent regulation and control capabilities; the metasurface unit further comprises a power amplifier arranged on the first metal layer, with one end of the power amplifier connected to the phase shifter, and the other end connected to the transmitting metal by plated through-holes.

In some exemplary embodiments, the intermediate layer comprises a first dielectric layer, a third metal layer, a prepreg, and a second dielectric layer which are sequentially stacked, wherein for direct current signals, the third metal layer serves as a ground to provide a reference level for a direct current voltage; for radio frequency signals, the third metal layer serves as a metallic reflective surface to enhance reflection capability for electromagnetic wave signals.

In some exemplary embodiments, the metasurface unit further comprises a first bias signal line and a second bias signal line arranged on the first metal layer, wherein the first bias signal line is connected to the receiving metal patch by plated through-holes and suppresses a radio frequency signal from the receiving metal patch by using a quarter-wavelength high-impedance line cascading a fan-shaped segment, providing a direct current path for a bias signal; the second bias signal line is connected to one end of the phase shifter and suppresses a radio frequency signal from the receiving metal patch by using a quarter-wavelength high-impedance line cascading a fan-shaped segment; the other end of the phase shifter is grounded through inductor $L_1$.

In some exemplary embodiments, a capacitor $C_0$ is disposed between the receiving metal patch and the phase shifter, and the capacitor $C_0$ is used to isolate a first bias signal and a second bias signal.

In some exemplary embodiments, the receiving metal patch and the transmitting metal patch are laid parallel on a surface of the intermediate layer; the power amplifier is a unilateral power amplifier; the first metal layer integrates with the unilateral power amplifier to amplify electromagnetic wave signals when x-polarized waves enter the metasurface unit in a forward direction; due to the orthogonal orientation of the slots on the receiving metal patch and the transmitting metal patch, reflected waves are converted into y-polarized waves; if y-polarized waves are reversed and incident back onto the metasurface unit, the electromagnetic wave signals are attenuated, and the reflected waves convert into x-polarized waves.

In some exemplary embodiments, the slots on the receiving metal patch comprise a first slot and a second slot, and the first slot and the second slot are symmetrical along the longitudinal central axis.

In some exemplary embodiments, the two diodes on the receiving metal patch are positioned between the first slot and the second slot; a distance between the two diodes is greater than half a length of the first slot in a direction along the longitudinal central axis, and less than the length of the first slot in the direction along the longitudinal central axis.

In some exemplary embodiments, both the first slot and the second slot are rectangular slots; a length direction of the rectangular slots is parallel to the longitudinal central axis.

In some exemplary embodiments, the slot on the transmitting metal patch is a U-shaped slot; a length direction of the U-shaped slot is perpendicular to the length direction of the first slot or the second slot.

In some exemplary embodiments, both the first metal layer and the second metal layer are made of copper materials; the first metal layer and the second metal layer have a same thickness.

The technical solutions provided in the embodiments of the present application have at least the following advantages:

A 2-bit high-power amplifying non-reciprocal reflective metasurface is provided according to the embodiments of the present application, comprising a plurality of metasurface units distributed in an array, wherein each of the metasurface units comprises a first metal layer, an intermediate layer, and a second metal layer which are sequentially stacked, wherein the second metal layer comprises a receiving metal patch and a transmitting metal patch; two diodes are disposed on the receiving metal patch, and the two diodes are both positioned on a longitudinal central axis of the receiving metal patch; slots are formed on both the transmitting metal patch and the receiving metal patch, and orientation of the slot on the transmitting metal patch is orthogonal to orientation of the slot on the receiving metal patch; the first metal layer comprises a phase shifter, which comprises first series diodes and second series diodes; the first series diodes and the second series diodes each comprise two diodes in series, and the first series diodes are connected in parallel at both ends of the second series diodes; the first series diodes and the second series diodes form a reconfigurable 90-degree phase-shift circuit; by adjustment of states of the diodes on the receiving metal patch and states of the first series diodes and the second series diodes in the phase shifter, electromagnetic wave phase achieves 2 bits, i.e., allowing for four independent regulation and control capabilities; the metasurface unit further comprises a power amplifier arranged on the first metal layer, with one end of the power amplifier connected to the phase shifter, and the other end connected to the transmitting metal patch by plated through-holes.

A 2-bit high-power amplifying non-reciprocal reflective metasurface is provided according to the present application. On the one hand, a metasurface unit structure integrating a power amplifier and a phase shifter has been designed, which ensures stable gain amplification properties while enabling stable phase modulation, i.e., achieving a power-amplifying metasurface unit with adjustable gain and phase. On the other hand, a metasurface unit structure with a cascading power amplifier and phase shifter has been designed, which achieves non-reciprocal reflective transmission of electromagnetic waves in the form of orthogonal polarization conversion. Furthermore, the metasurface unit structure with a cascading power amplifier and phase shifter designed according to the present application ensures that the phase modulation-based metasurfaces can function properly even in high-power scenarios.

BRIEF DESCRIPTION OF THE DRAWINGS

One or more embodiments are illustrated by images in their corresponding accompanying drawings, and these exemplary explanations do not limit the embodiments. Unless specifically stated, the images in the accompanying drawings do not constitute a proportion limitation.

DETAILED DESCRIPTION OF THE EMBODIMENTS

Figure 1:
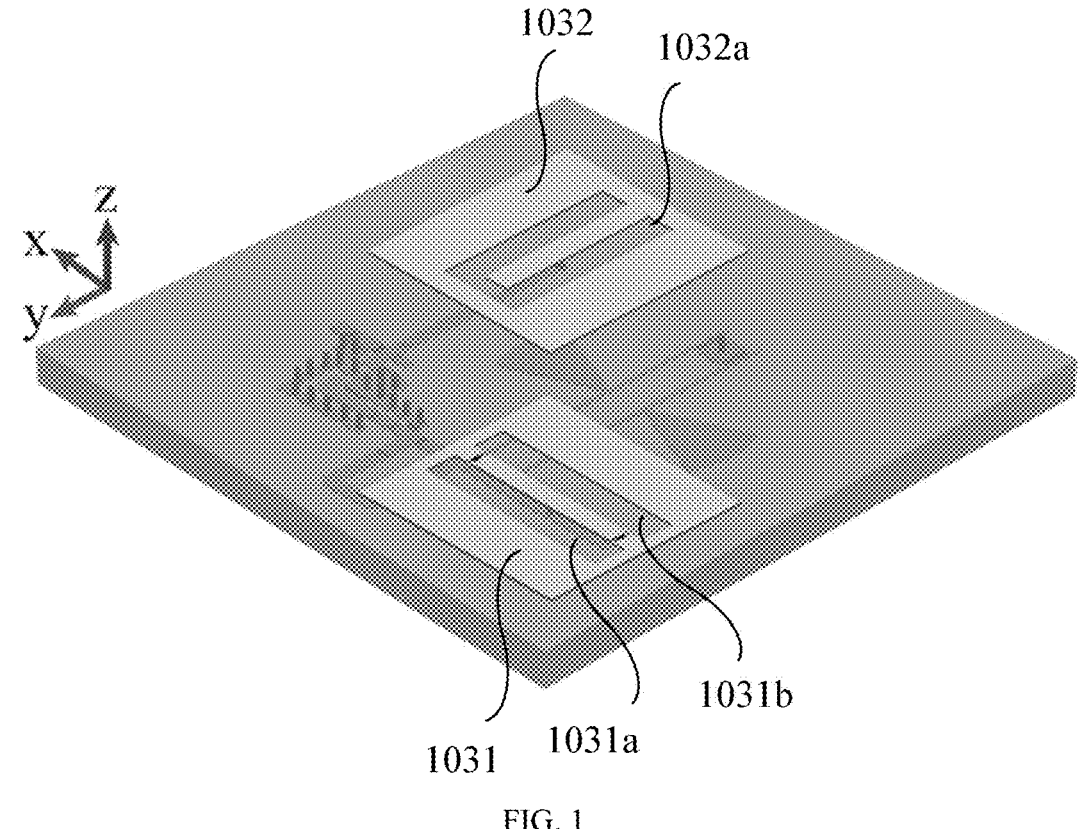
FIG. 1 is a schematic three-dimensional view of a metasurface unit in a 2-bit high-power amplifying non-reciprocal reflective metasurface structure according to an embodiment of the present application.

As known from the Background section, existing power-amplifying metasurfaces cannot achieve stable quantized regulation and control of electromagnetic wave phases while amplifying electromagnetic energy.

Metasurfaces, artificial electromagnetic surfaces, are two-dimensional novel electromagnetic materials composed of sub-wavelength artificial units arranged periodically or non-periodically. By designing their unit structures, sizes, and array topologies, metasurfaces can exhibit unique electromagnetic properties not found in natural materials. Moreover, metasurfaces possess characteristics such as thinness, light weight, simple preparation processes, and ease of integration. Therefore, metasurfaces are widely researched and applied in the electromagnetic and communication fields. Metasurfaces can be classified as static or dynamic based on the adjustability thereof. Static metasurfaces typically involve purely passive designs, where their electromagnetic properties completely depend on passive structures and cannot be dynamically adjusted; while dynamic metasurfaces usually incorporate active devices or special materials, such as switching diodes (PINs), varactors, MEMS switches, liquid crystals, graphene, vanadium dioxide, etc. By applying specific conditions to alter the operational state of the active devices or properties of the special materials, dynamic control of electromagnetic waves is achieved. Hence, dynamic metasurfaces are more suitable for complex communication environments. Particularly, for the regulation and control of electromagnetic wave phase, different bit numbers are used to describe the quantification of phase states. For example, 1 bit represents two phase states, with a phase difference of 180 degrees between adjacent states; 2 bits represent four phase states, with a phase difference of 90 degrees between adjacent states, and so on.

Non-reciprocity means that electromagnetic waves exhibit different electromagnetic losses, phase shifts, and other properties when transmitted in opposite directions in a certain object. Non-reciprocal materials have found wide applications across various physical branches like thermodynamics, mechanics, electromagnetics, optics, etc. Devices such as circulators and isolators, which are irreversible, are widely used in radar and communication systems. Generally, the above-mentioned three types of metasurfaces integrated with lossy devices exhibit reciprocity in manipulating electromagnetic waves. Specifically, metasurfaces integrated with lossy devices, such as switching diodes (PINs), varactors, and MEMS switches, exhibit reciprocity in manipulating electromagnetic waves. Conventional non-reciprocal devices in electromagnetics are primarily composed of magnetic materials like ferrites. However, such materials typically have larger volumes, higher costs, and are difficult to integrate with metasurfaces. Some scholars have proposed magnetless non-reciprocal metasurfaces, which involve the integration of transistor-like amplifiers or isolators into metasurface structures. This approach aims to achieve magnetless non-reciprocal metasurfaces with smaller sizes and better integrability. Additionally, other scholars have proposed asymmetric metamaterials based on time modulation, although the complexity of their control systems has been significantly increased.

Power amplifiers are typical physical boundary devices and serve as fundamental units for various microwave circuit functional devices. Power amplifiers exhibit operational properties of strong nonlinearity, non-reciprocity, and energy enhancement. Compared with the three types of lossy devices mentioned above, power amplifiers serve as binary boundary devices. They possess nonlinearity, non-reciprocity, and energy-enhancement properties while being influenced by two variables of direct current bias and electromagnetic matching. In recent years, the integration of active unilateral power amplifier devices with metasurfaces has led to power-amplifying metasurfaces, realizing multiple physical properties. These properties include magnetless non-reciprocity, enhanced reflection, high-power absorption, and full-duplex reflective wave beams, sparking enthusiasm among researchers both domestically and internationally.

The polarization of electromagnetic waves is typically represented by the trajectory traced in space by the end-points of the electric-field intensity vector over time. Polarization conversion refers to altering the polarization mode of electromagnetic waves, such as transforming linearly polarized waves into circularly polarized waves or co-polarized waves into cross-polarized waves. Conventional methods for achieving polarization conversion involve the use of transition waveguides, and the like. Polarization conversion metasurfaces offer a new approach to achieve the polarization conversion of electromagnetic waves. Through the specialized design of unit structures, polarization conversion between incident and scattered waves is enabled, which holds significant application value in electromagnetic fields and wireless communications.

A related technology proposes a transmissive metasurface unit structure integrated with a power amplifier, which achieves non-reciprocal electromagnetic wave transmission by cascading receiving and transmitting patches with two amplifiers and achieves controllable gain by adjusting bias voltages. However, compared to a reflective metasurface, a transmissive metasurface facilitates easier beam control but does not inherently regulate and control the phase of electromagnetic waves. Another related technology proposes a reconfigurable reflective metasurface unit structure integrated with a power amplifier, which, by designing patch units with two orthogonal hourglass-shaped coupling slots, realizes amplification for orthogonal polarization waves within a relatively wide frequency range. However, such metasurface unit structure does not regulate and control the phase of electromagnetic waves; rather, it only controls the amplitude gain of electromagnetic waves through integrated amplifiers, unable to control the beam angles. Yet another related technology proposes a reflective metasurface unit structure in the form of cascaded radiating patches, amplifiers, and phase shifters, which, through a periodically graded phase arrangement, achieves magnetless non-reciprocal beam radiation and amplification in specific directions. However, the phase corresponding to each unit is predetermined and fixed through the phase shifter, unable to dynamically control the phase.

As known from the above description, existing power-amplifying metasurfaces have power amplifiers cascaded in their metasurface units to achieve electromagnetic wave energy amplification, which is one of their advantages. However, the current design for the power-amplifying metasurface structure normally can only amplify signal energy, i.e., enhancing the amplitude of electromagnetic waves, without achieving stable quantized phase regulation and control while amplifying electromagnetic waves. In light of these technical issues in existing power-amplifying meta-surfaces, the present application provides a 2-bit high-power amplifying non-reciprocal reflective metasurface.

To address the technical issues mentioned above, a 2-bit high-power amplifying non-reciprocal reflective metasur-face is provided according to the embodiments of the present application, which comprises a plurality of metasurface units distributed in an array. Each metasurface unit com-prises a first metal layer, an intermediate layer, and a second metal layer which are sequentially stacked. The second metal layer comprises a receiving metal patch and a trans-mitting metal patch. Two diodes are disposed on the receiv-ing metal patch, and the two diodes are both positioned on the longitudinal central axis of the receiving metal patch. Slots are formed on both the transmitting metal patch and the receiving metal patch, and the orientation of the slot on the transmitting metal patch is orthogonal to the orientation of the slot on the receiving metal patch. The first metal layer comprises a phase shifter, which comprises first series diodes and second series diodes. The first series diodes and the second series diodes each comprise two diodes in series, and the first series diodes are connected in parallel at both ends of the second series diodes. The first series diodes and the second series diodes form a reconfigurable 90-degree phase-shift circuit. By adjustment of the states of the diodes on the receiving metal patch and the states of the first series diodes and the second series diodes in the phase shifter, the electromagnetic wave phase achieves 2 bits, i.e., allowing for four independent regulation and control capabilities. The metasurface unit further comprises a power amplifier arranged on the first metal layer, with one end of the power amplifier connected to the phase shifter and the other end connected to the transmitting metal patch by plated through-holes. The present application aims to provide a power-amplifying reflective metasurface design with adjustable gain and phase. The design of a 2-bit high-power amplifying non-reciprocal reflective metasurface ensures stable gain amplification properties while enabling stable phase modu-lation.

The respective embodiments of the present application will be described in detail below with reference to the accompanying drawings. However, those of ordinary skill in the art can understand that in the various embodiments of the present application, numerous technical details are set forth in order to enable readers to better understand the present application. However, the technical solutions claimed by the present application can also be implemented even without these technical details and the various changes and modifi-cations based on the following embodiments.

Figure 2:
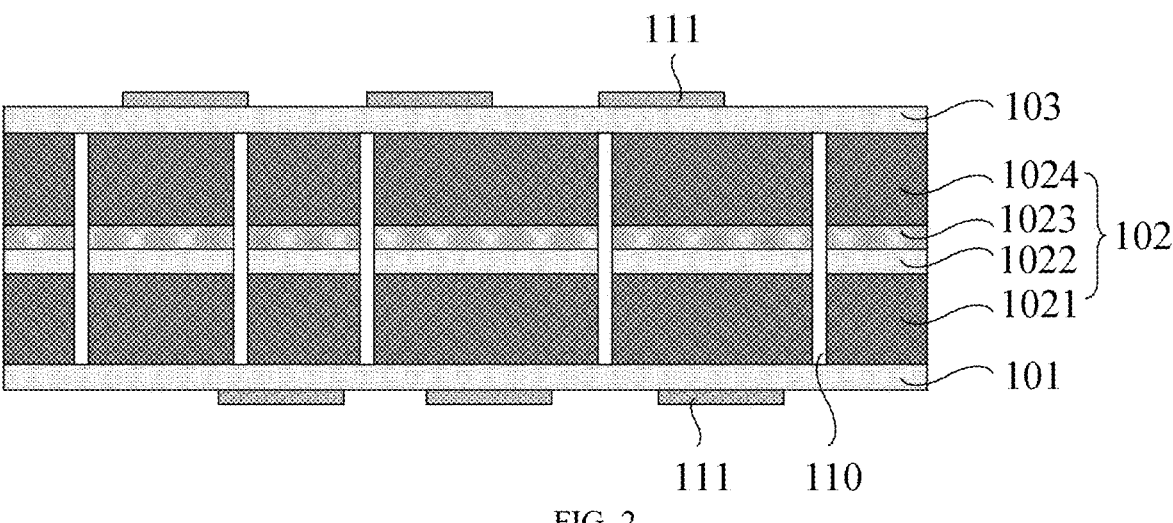
FIG. 2 is a side view of a metasurface unit in a 2-bit high-power amplifying non-reciprocal reflective metasurface structure according to an embodiment of the present application.

A 2-bit high-power amplifying non-reciprocal reflective metasurface is provided according to the embodiment of the present application, as shown in FIG. 1. FIG. 1 is a sche-matic three-dimensional view of a metasurface unit in the 2-bit high-power amplifying non-reciprocal reflective meta-surface structure according to the embodiment of the present application. The 2-bit high-power amplifying non-reciprocal reflective metasurface provided according to the embodi-ment of the present application comprises a plurality of metasurface units distributed in an array. FIG. 2 illustrates a side view of a metasurface unit according to the embodiment of the present application. As shown in FIG. 2, each meta-surface unit comprises a first metal layer 101, an interme-diate layer 102, and a second metal layer 103 which are sequentially stacked. The second metal layer 103 is posi-tioned above the first metal layer 101, and the intermediate layer 102 is positioned between the first metal layer 101 and the second metal layer 103. As shown in FIG. 2, components 111 are laid on the first metal layer 101 and the second metal layer 103, and a plurality of plated through-holes 110 penetrating the intermediate layer 102 are formed on the intermediate layer 102. Different plated through-holes 110 are used to establish connections between different compo-nents 111 and the respective layers.

Continuing to refer to FIG. 2, the intermediate layer 102 comprises a first dielectric layer 1021, a third metal layer 1022, a prepreg 1023, and a second dielectric layer 1024 which are sequentially stacked. For direct current signals, the third metal layer 1022 serves as the ground to provide a reference level for a direct current voltage; for radio fre-quency signals, the third metal layer 1022 serves as a metallic reflective surface to enhance reflection capability for electromagnetic wave signals. Both the first dielectric layer 1021 and the second dielectric layer 1024 are made of Rogers4350 material ($\varepsilon r=3.66$, tan $\delta=0.004$), and the prepreg 1023 is made of Rogers 4450F material ($\varepsilon r=3.52$, tan $\delta=0.004$). In addition, in some embodiments, to facilitate the wiring of bias lines for the metasurface, multiple dielec-tric layers need to be added. For example, three dielectric layers can be added between the second metal layer 103 and the second dielectric layer 1024, with a layer of prepreg disposed between adjacent dielectric layers.

Figure 3:
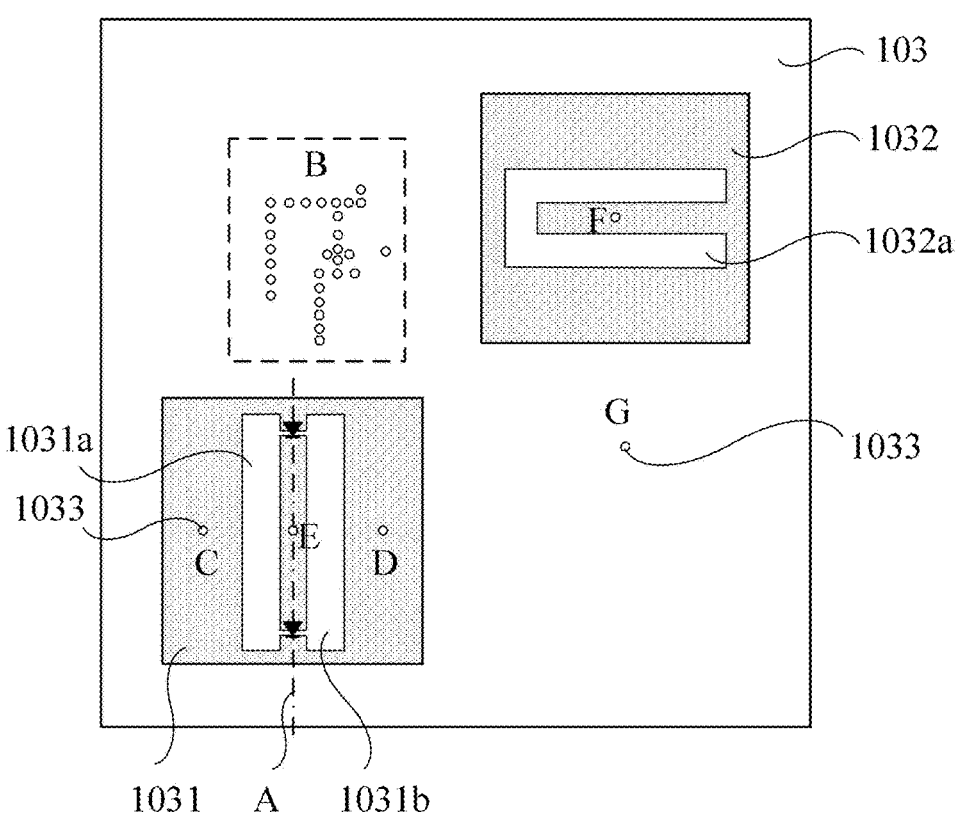
FIG. 3 is a schematic diagram of the planar structure of a second metal layer according to an embodiment of the present application.

Referring to FIG. 3, the second metal layer 103 comprises a receiving metal patch 1031 and a transmitting metal patch 1032. Two diodes are disposed on the receiving metal patch 1031, and the two diodes are both positioned on the longi-tudinal central axis A of the receiving metal patch 1031. Slots are formed on both the transmitting metal patch 1032 and the receiving metal patch 1031, and the orientation of the slot on the transmitting metal patch 1032 is orthogonal to the orientation of the slot on the receiving metal patch 1031. As shown in FIG. 3, the receiving metal patch 1031 is positioned at the bottom left of the second metal layer 103, and the transmitting metal patch 1032 is positioned at the top right of the second metal layer 103. The two diodes are both positioned on the longitudinal central axis A of the receiving metal patch 1031. In other words, the connecting line of the two diodes coincides with the longitudinal central axis A of the receiving metal patch 1031. For example, both diodes are PIN diodes.

Specifically, the receiving metal patch 1031 is a recon-figurable receiving metal patch with an O-shaped slot-like metal structure loaded with a PIN diode at each end of its longitudinal centerline A. The receiving metal patch 1031 converts the linearly polarized waves in space into quasi-TEM waves in the microstrip line by plated through-holes 110. The two PIN diodes are placed in the same direction along the longitudinal centerline A. Two plated through-holes are formed on the left and right sides of the receiving metal patch 1031, serving as control voltage references for the PIN diodes. Under positive bias voltage, the lower PIN diode switches to a conducting state while the upper PIN diode is in a cut-off state. Under negative bias voltage, the states of the PIN diodes reverse compared to when under positive bias voltage. Switching the control voltage from positive to negative generates current in the opposite direc-tion, enabling the receiving metal patch 1031 to generate a 180-degree phase difference with the cascaded phase-shift circuit.

As mentioned earlier, a plurality of plated through-holes 110 penetrating the intermediate layer 102 are formed on the intermediate layer 102. Different plated through-holes 110 are used to establish connections between different components 111 and the respective layers. Specifically, as shown in FIG. 3, a plurality of through holes at the top left B are used to ground devices in the power amplifier circuit, i.e., connecting to the third metal layer 1022 within the intermediate layer 102. For the three through holes positioned at the bottom-left receiving metal patch 1031, the left and right through holes (labeled C, D in FIG. 3) are used to connect the third metal layer 1022 within the intermediate layer 102 and provide reference ground level for direct current signals, while the through hole (labeled E in FIG. 3) at the center of the receiving metal patch 1031 is used to connect to the circuit of the first metal layer 101. The hole (labeled F in FIG. 3) positioned at the top-right transmitting metal patch 1032 is used to connect to the circuit of the first metal layer 101. The hole (labeled G in FIG. 3) at the bottom right is used for the entrance of the bias line to connect to the ground for capacitors C8, C9, C10, and C11 (as shown at the bottom left of FIG. 5), i.e., connecting to the third metal layer 1022 within the intermediate layer 102.

In some embodiments, the slots on the receiving metal patch 1031 comprise a first slot 1031a and a second slot 1031b, and the first slot 1031a and the second slot 1031b are symmetrical along the longitudinal central axis A.

In some embodiments, the two diodes on the receiving metal patch 1031 are positioned between the first slot 1031a and the second slot 1031b. The distance between the two diodes is greater than half the length of the first slot 1031a in the direction along the longitudinal central axis A, and less than the length of the first slot 1031a in the direction along the longitudinal central axis A. Alternatively, the distance between the two diodes is greater than half the length of the second slot 1031b in the direction along the longitudinal central axis A, and less than the length of the second slot 1031b in the direction along the longitudinal central axis A.

As shown in FIG. 2, in some embodiments, both the first slot 1031a and the second slot 1031b are rectangular slots; the length direction of the rectangular slots is parallel to the longitudinal central axis A.

It should be noted that a plurality of through holes 1033 are also formed on the receiving metal patch 1031. The through holes 1033 communicate with their corresponding plated through-holes 110 on the intermediate layer 102. A through hole 1033 is formed on each of the left and right sides of the receiving metal patch 1031, and the two through holes 1033 respectively communicate with two plated through-holes 110 on the intermediate layer 102, serving as control voltage references for the PIN diodes.

In some embodiments, the slot on the transmitting metal patch 1032 is a U-shaped slot 1032a. The length direction of the U-shaped slot 1032a is perpendicular to the length direction of the first slot 1031a or the second slot 1031b.

In some embodiments, the receiving metal patch 1031 and the transmitting metal patch 1032 are laid parallel on the intermediate layer 102, and slots are formed on both the receiving metal patch 1031 and the transmitting metal patch 1032. Specifically, the slots on the receiving metal patch 1031 are rectangular, and the slot on the transmitting metal patch 1032 is U-shaped. The rectangular and U-shaped slots are orthogonally arranged, that is, the extension direction of the rectangular slots is perpendicular to that of the U-shaped slot. The orthogonal orientation of the slots on the receiving metal patch 1031 and the transmitting metal patch 1032 is essential to ensure that the gain of the power amplifier 1012 is less than the isolation between the transmitting and receiving ports. This ensures the stability of the power amplifier 1012.

In some embodiments, both the first metal layer 101 and the second metal layer 103 are made of copper materials; the first metal layer 101 and the second metal layer 103 have the same thickness.

In some embodiments, the third metal layer 1022 can also be made of copper material. The thickness of the third metal layer 1022 can be the same as that of the first metal layer 101 and the second metal layer 103, or it can be different.

It should be noted that both the receiving metal patch 1031 and the transmitting metal patch 1032 are arranged on the surface of the second metal layer 103 away from the intermediate layer 102 (the second dielectric layer 1024). In other words, both the receiving metal patch 1031 and the transmitting metal patch 1032 are arranged on the upper surface of the second metal layer 103. The second metal layer 103 is arranged above the first metal layer 101. In other words, both the receiving metal patch 1031 and the transmitting metal patch 1032 are arranged on the top surface of the metasurface unit.

Figure 4:
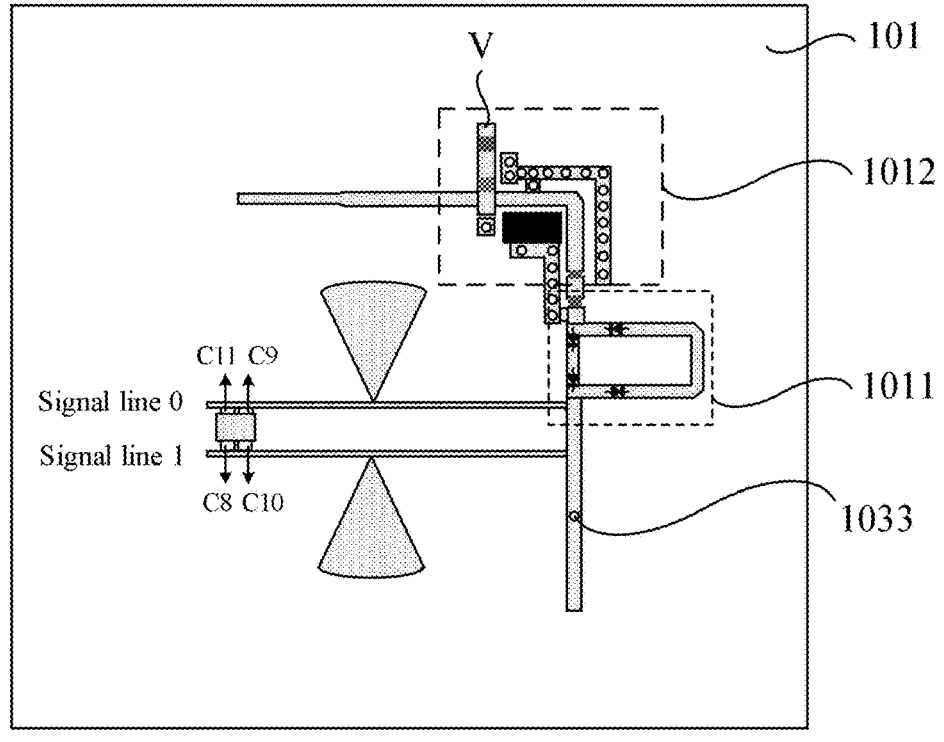
FIG. 4 is a schematic diagram of the planar structure of a first metal layer according to an embodiment of the present application.

Referring to FIG. 4, the first metal layer 101 comprises a phase shifter 1011, which comprises first series diodes and second series diodes. The first series diodes and the second series diodes each comprise two diodes in series, and the first series diodes are connected in parallel at both ends of the second series diodes. The first series diodes and the second series diodes form a reconfigurable 90-degree phase-shift circuit. By adjustment of the states of the diodes on the receiving metal patch 1031 and the states of the first series diodes and the second series diodes in the phase shifter 1011, the electromagnetic wave phase achieves 2 bits, i.e., allowing for four independent regulation and control capabilities. As shown in FIG. 4, signal line 0 corresponds to the second bias signal line, and signal line 1 corresponds to the first bias signal line.

Figure 5:
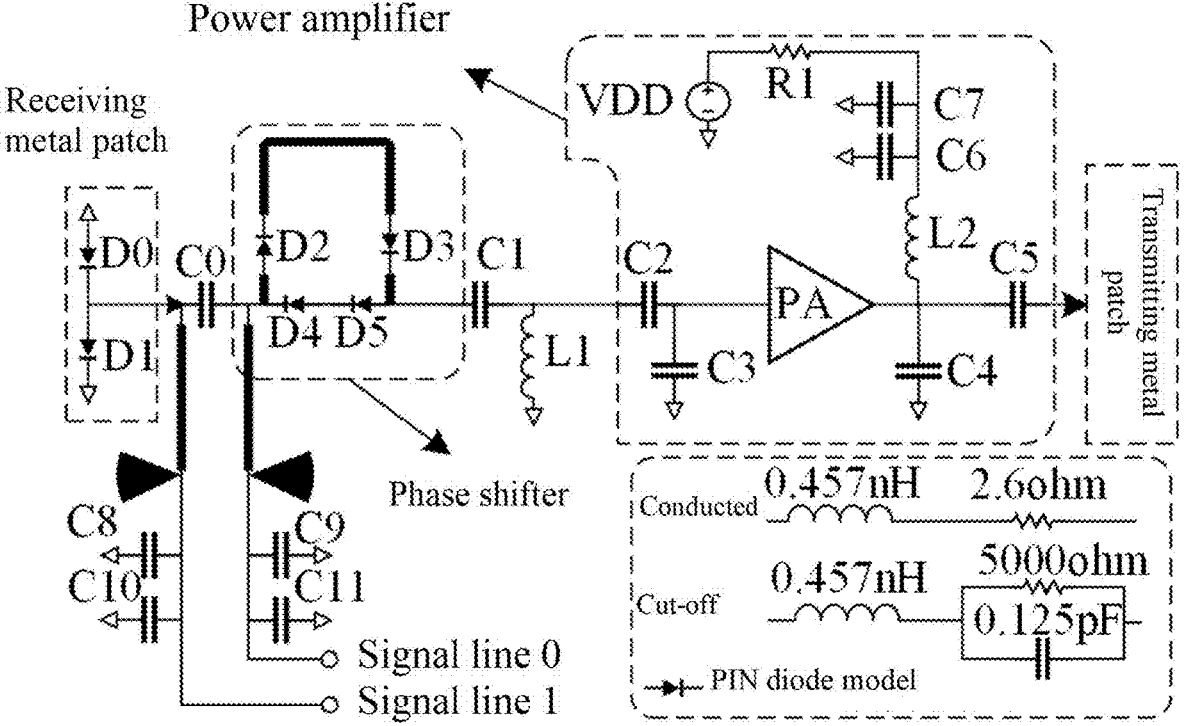
FIG. 5 is a circuit diagram of a metasurface unit according to an embodiment of the present application.

It should be noted that the bias voltage for the power amplifier 1012 applied at point V of the power amplifier 1012 in FIG. 4 corresponds to VDD in FIG. 5.

Specifically, the phase shifter 1011 is a 90-degree reconfigurable phase shifter. To enhance the surface element's phase resolution of electromagnetic waves, the present application combines four PIN diodes to achieve a reconfigurable 90-degree phase-shift circuit. As shown in FIG. 5, under positive bias voltage, the first series diodes (comprising diodes D2 and D3 in series) are switched to a conducting state, and the second series diodes (comprising diodes D4 and D5 in series) are switched to a cut-off state. Under negative bias voltage, the first series diodes (comprising diodes D2 and D3 in series) are switched to a cut-off state, and the second series diodes (comprising diodes D4 and D5 in series) are switched to a conducting state. The phase shifter 1011 thus enables the signal to pass through different path lengths, achieving a 90-degree phase difference. For the direct current path of the phase shifter 1011, one end of the phase shifter is grounded via inductor $L_1$, providing a reference voltage for the PIN diodes, while the other end uses a quarter-wavelength high-impedance line cascading a fan-shaped segment to suppress radio frequency signals from the receiving metal patch 1031. At the rear end, direct current bias voltage is applied for the PIN diode, i.e., the bias signal line 0.

In some embodiments, the above-mentioned metasurface unit further comprises a first bias signal line (bias signal line 1) and a second bias signal line (bias signal line 0) arranged on the first metal layer 101. Bias signal line 1 is connected to the back of the receiving metal patch 1031. The first bias signal line (signal line 1 in FIG. 5) is connected to the receiving metal patch 1031 by plated through-holes and suppresses the radio frequency signal from the receiving metal patch 1031 by using a quarter-wavelength high-impedance line cascading a fan-shaped segment, providing a direct current path for the bias signal. The second bias signal line (signal line 0 in FIG. 5) is connected to one end of the phase shifter 1011 and suppresses the radio frequency signal from the receiving metal patch 1031 by using a quarter-wavelength high-impedance line cascading a fan-shaped segment. The other end of the phase shifter 1011 is grounded through inductor $L_1$.

In some embodiments, a capacitor $C_0$ is disposed between the receiving metal patch 1031 and the phase shifter 1011. The capacitor $C_0$ is used to isolate the first bias signal (signal line 1 in FIG. 5) and the second bias signal (signal line 0 in FIG. 5). This arrangement allows achieving four discrete phase states of the metasurface unit by adjustment of the two control voltages applied to the PIN diodes on the reconfigurable receiving metal patch and the reconfigurable phase shifter. The bottom right of FIG. 5 illustrates the equivalent circuit model of the PIN diodes in different states.

In some embodiments, the metasurface unit further comprises a power amplifier 1012 arranged on the first metal layer 101. One end of the power amplifier 1012 is connected to the phase shifter 1011, and the other end is connected to the transmitting metal patch 1032 by plated through-holes. The power amplifier 1012 is a unilateral power amplifier. The first metal layer 101 integrates with the unilateral power amplifier to amplify electromagnetic wave signals when x-polarized waves enter the metasurface unit in the forward direction. Due to the orthogonal orientation of the slots on the receiving metal patch 1031 and the transmitting metal patch 1032, the reflected waves are converted into y-polarized waves. If y-polarized waves are reversed and incident back onto the metasurface unit, the electromagnetic wave signals are attenuated, and the reflected waves convert into x-polarized waves. This provides the metasurface unit with non-reciprocal properties. Additionally, the orthogonal orientation of the slots on the receiving metal patch 1031 and the transmitting metal patch 1032 is essential to ensure that the gain of the power amplifier 1012 is less than the isolation between the transmitting and receiving ports. This ensures the stability of the power amplifier 1012.

Considering that the input impedance of the power amplifier is irrelevant to the amplifier performance, for convenience in simulations, the output impedance of the receiving metal patch 1031 was set to the standard 50 ohms. However, the proposed method is not limited to this standard impedance. The insertion of a unilateral power amplifier between the reconfigurable phase shifter and the transmitting metal patch 1032 enables the amplification of incident waves as well as the non-reciprocal transmission. Furthermore, compared to metasurface units that only integrate PIN diodes, the power amplifier has higher output power capabilities, thus enhancing the power-carrying capacity of the metasurface unit. The present application selected the TQP7M9102 model manufactured by QORVO for the power amplifier. This type of amplifier requires an external matching network to achieve its good performance, providing greater flexibility in the collaborative analog design of cascaded structures.

It should be noted that the phase shifter 1011 is arranged on the surface of the first metal layer 101 away from the intermediate layer 102 (first dielectric layer 1021). Likewise, the power amplifier 1012 is also arranged on the surface of the first metal layer 101 away from the intermediate layer

102 (first dielectric layer 1021). This means that both the phase shifter 1011 and the power amplifier 1012 are arranged on the lower surface of the first metal layer 101. In other words, both the phase shifter 1011 and the power amplifier 1012 are arranged on the bottom surface of the metasurface unit.

Figures 6, 7:
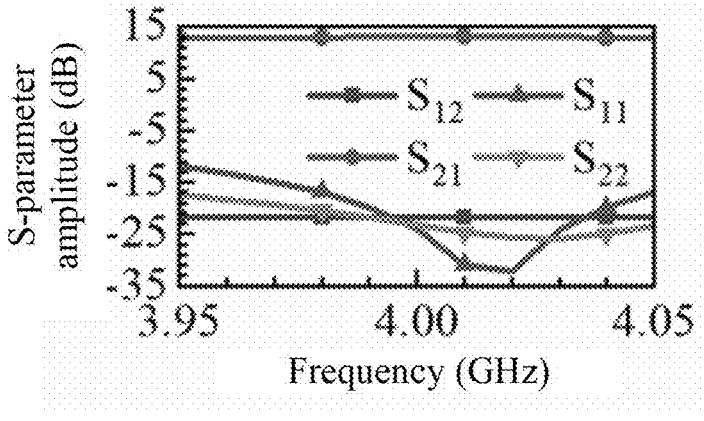
FIG. 6 illustrates the amplitude curve of S-parameters of a power amplifier circuit under a small signal model according to an embodiment of the present application.
FIG. 7 illustrates the stability curve of a power amplifier circuit under a small signal model according to an embodiment of the present application.

The dashed box at the top right of FIG. 5 illustrates a schematic diagram of the matching network of a power amplifier circuit. A suitable matching network was designed to meet the good performance of the amplifier. FIG. 6 illustrates the amplitude curve of the S-parameters obtained from a simulated amplifier circuit. The simulation indicates that the designed power amplifier circuit achieves a gain of over 10 dB and an isolation of over 20 dB, demonstrating that the amplifier circuit has good energy enhancement and non-reciprocity. Furthermore, stability is crucial for any integrated amplifier system. FIG. 7 illustrates the stability curve obtained from a simulated amplifier circuit, indicating that the amplifier circuit is in an unconditionally stable condition.

Figure 8:
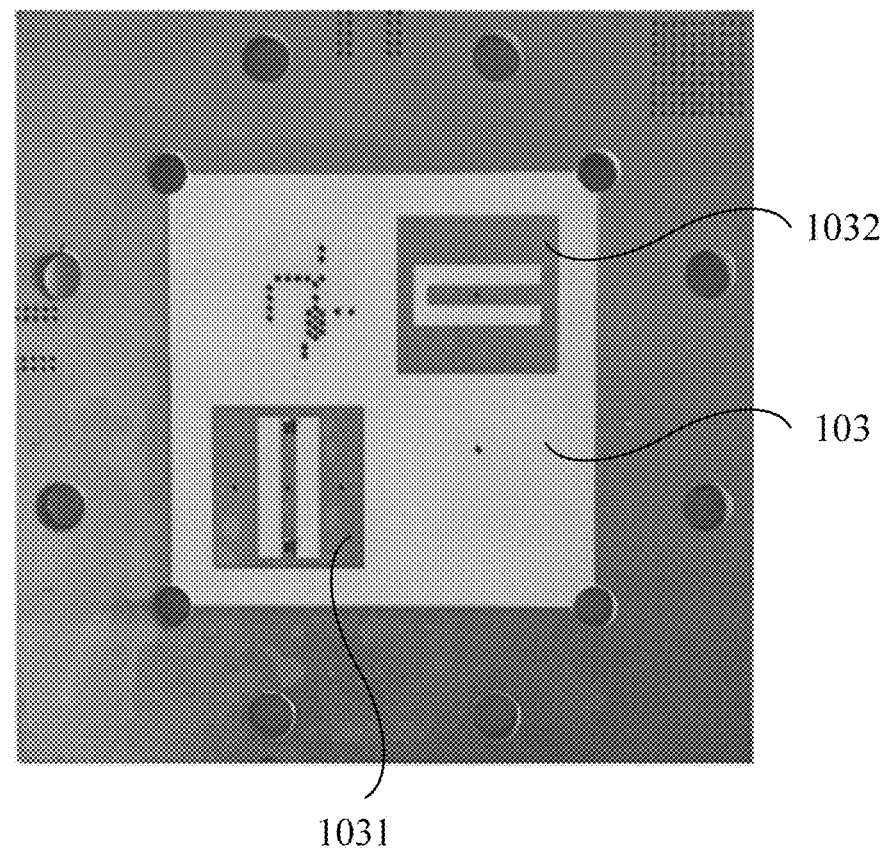
FIG. 8 is a schematic diagram of the physical structure of a second metal layer according to an embodiment of the present application.
Figure 9:
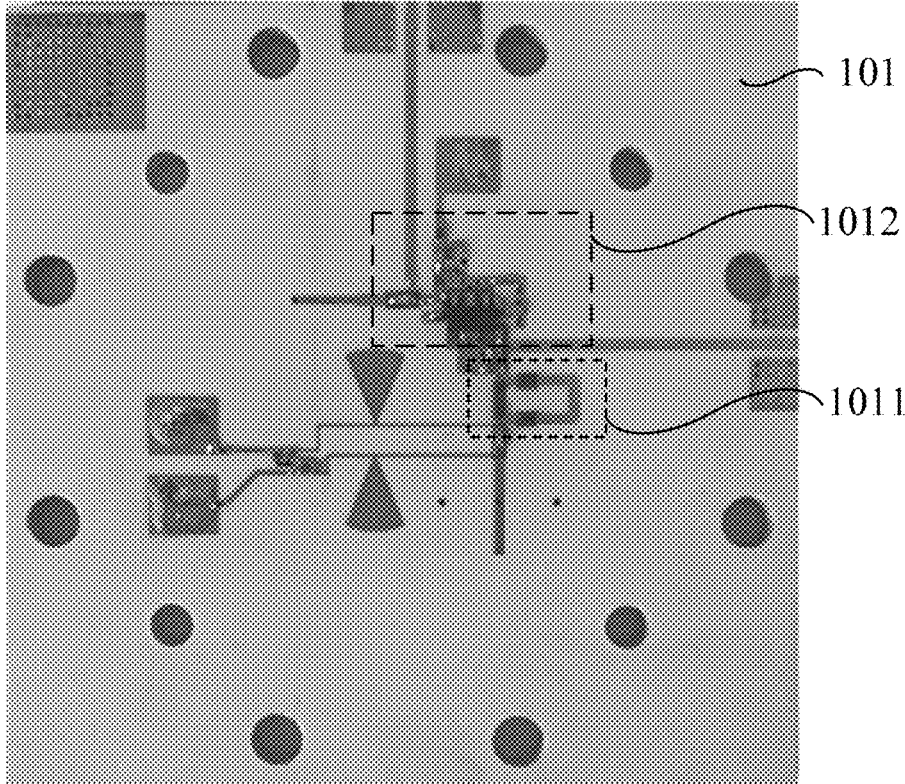
FIG. 9 is a schematic diagram of the physical structure of a first metal layer according to an embodiment of the present application.
Figure 10:
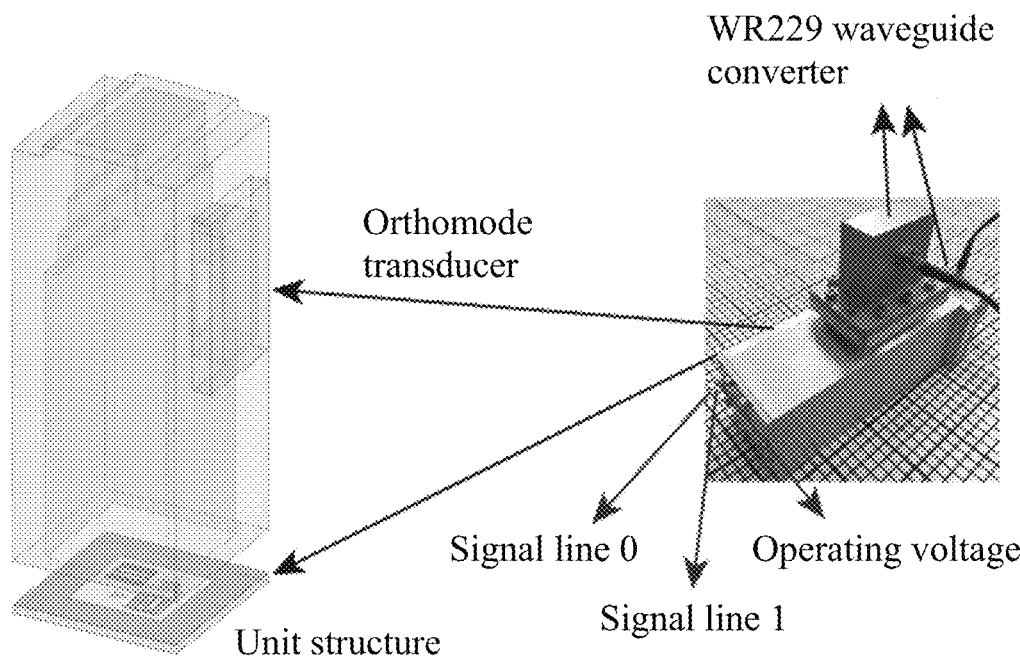
FIG. 10 is a schematic diagram of testing the 2-bit high-power amplifying non-reciprocal reflective metasurface structure according to an embodiment of the present application.
Figure 11:
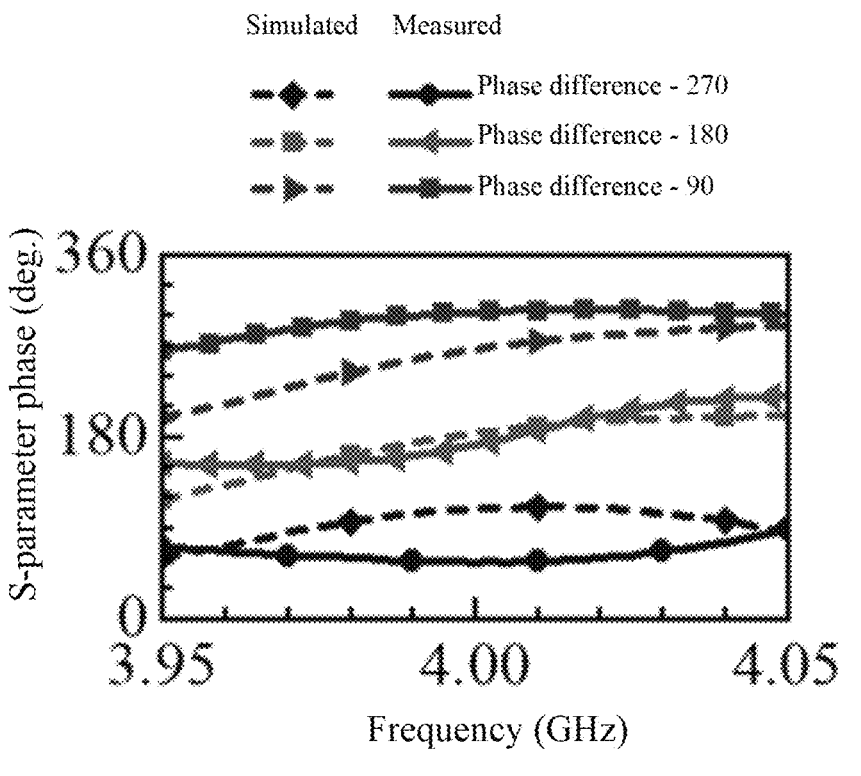
FIG. 11 illustrates the S-parameter phase curves of the proposed metasurface structure simulated and measured at an incident power of −30 dBm according to an embodiment of the present application, showing three phase differences corresponding to four different states.
Figure 12:
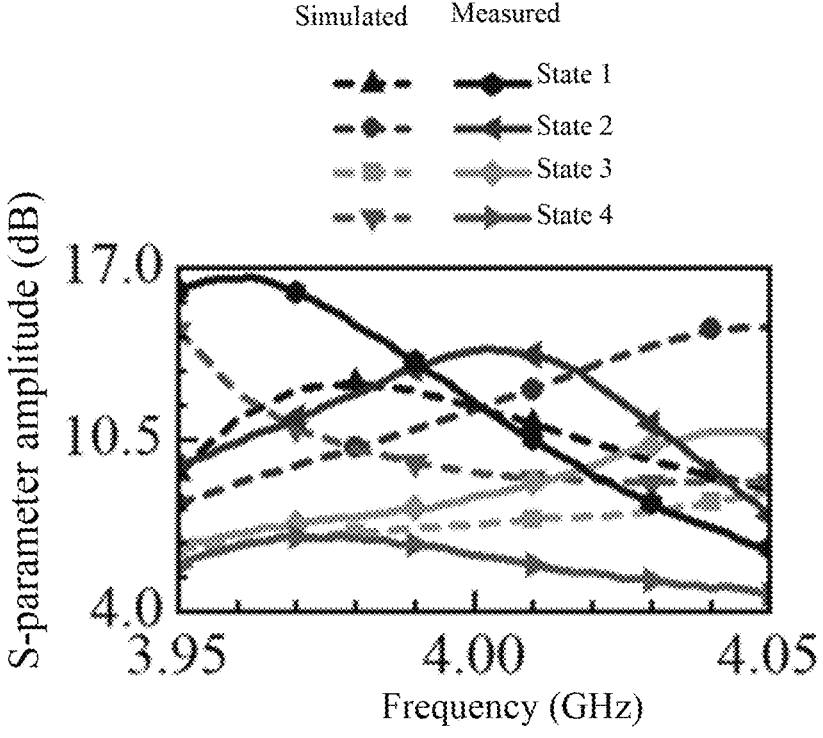
FIG. 12 illustrates the forward S-parameters amplitude curve of the proposed metasurface structure simulated and measured at an incident power of −30 dBm according to an embodiment of the present application, showing four states corresponding to 2 bits.
Figure 13:
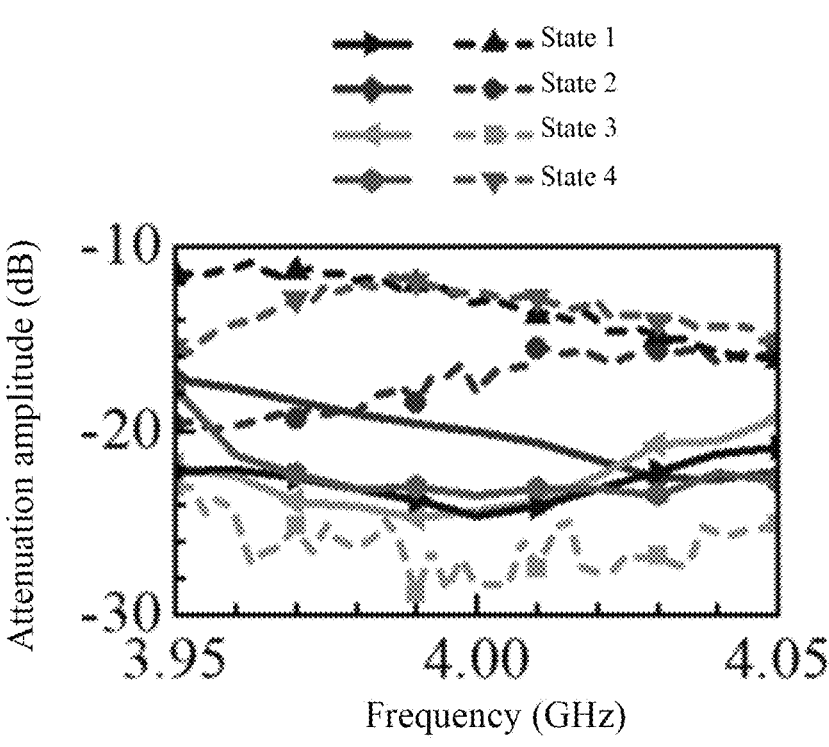
FIG. 13 illustrates the backward amplitude attenuation curve of the proposed metasurface unit structure simulated and measured at an incident power of −30 dBm according to an embodiment of the present application, showing four states corresponding to 2 bits.
Figure 14:
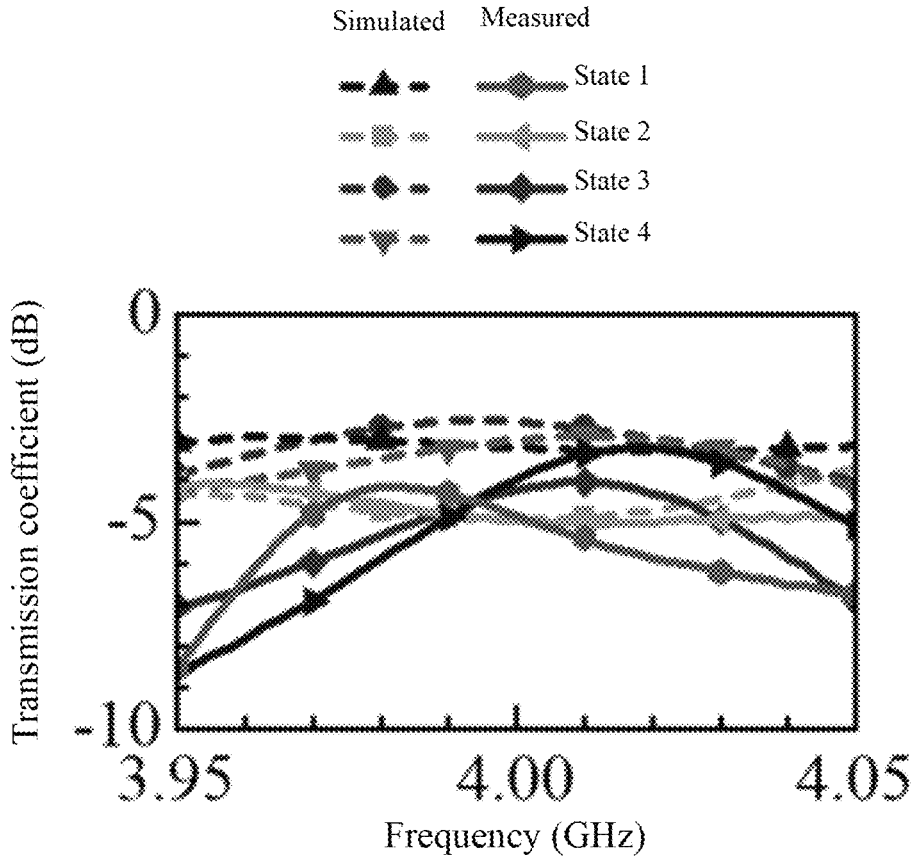
FIG. 14 illustrates the reflection coefficient amplitude curves of the proposed metasurface structure and the metasurface structure without an integrated power amplifier simulated and measured at an incident power of −30 dBm according to an embodiment of the present application, showing four states corresponding to 2 bits.

To validate the simulation design, an experimental test apparatus and a test method depicted as shown in FIG. 10 were developed. The left side of FIG. 10 illustrates the schematic simulation, and the right side of FIG. 10 illustrates the real measurement scenario. The proposed metasurface structure was connected to an orthomode transducer waveguide. A pair of orthogonally polarized waves were transmitted and received within the frequency range of 3.95 GHz to 4.05 GHz using two WR229 waveguide converters. The waveguide converters were connected to a vector network analyzer through a coaxial cable to measure the required data. FIGS. 8 and 9 illustrate physical representations of the second metal layer 103 and the first metal layer 101, respectively. As shown in FIGS. 8 and 9, to align with the actual orthomode transducer waveguide port, the structure size of the fabricated metasurface unit according to the present application was extended. As shown in FIG. 11, four discrete phase responses corresponding to three differential phase states can be achieved at a low input power level of −30 dBm, which validates the 2-bit phase regulation and control capability of the proposed metasurface structure. It can be observed in FIG. 12 that the forward-transmitted electromagnetic wave, reflected through the proposed structure, attained gains exceeding 4 dB across all four states. For backward transmission, an attenuation over 10 dB was observed in FIG. 13, demonstrating the non-reciprocal polarization conversion and enhancement properties of the proposed structure. Additionally, a performance comparison was made between the proposed structure and the proposed structure without an integrated amplifier. The transmission performance in the four discrete states for the proposed structure without an integrated amplifier is illustrated in FIG. 14. This indicates that the metasurface unit without an integrated amplifier, i.e., solely integrated with PIN diodes, can only attenuate the wave intensity but cannot increase it.

Figure 15:
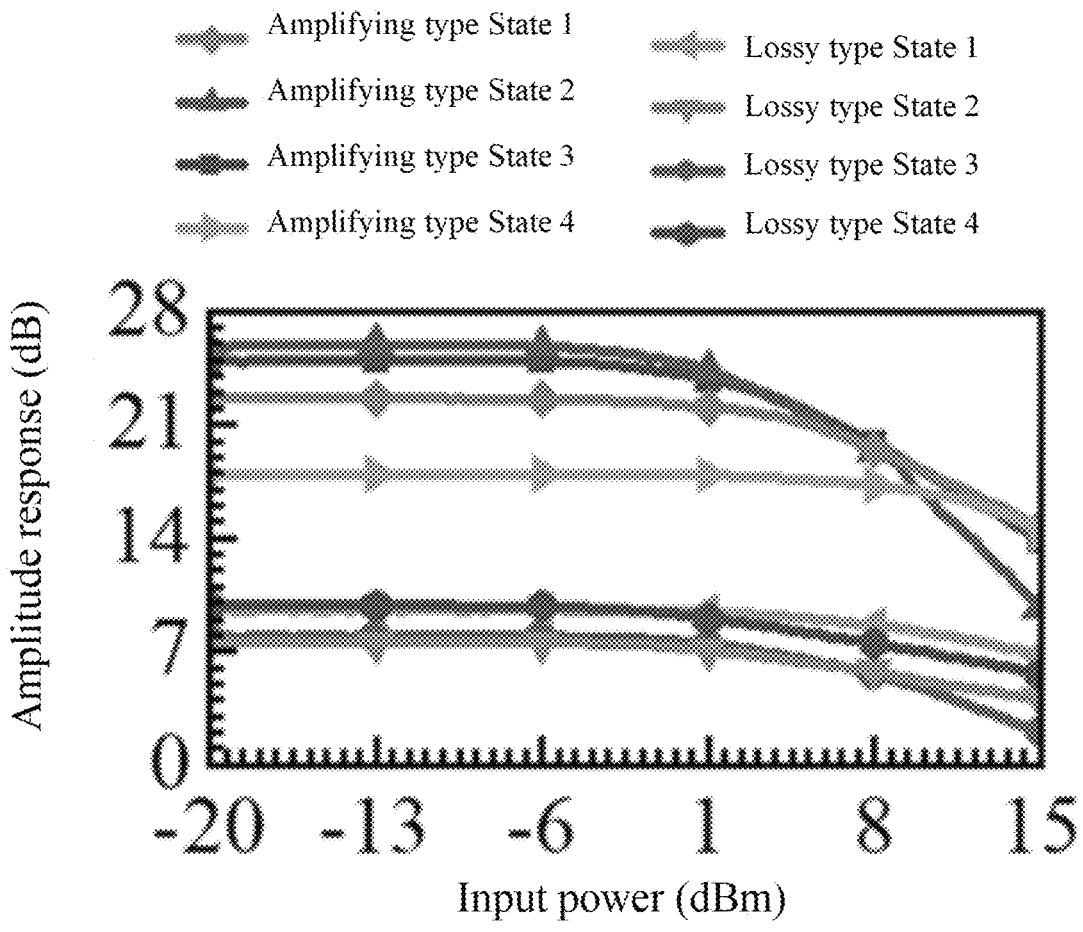
FIG. 15 illustrates the variation curve of the amplitude response as a function of the input power for the proposed metasurface structure and the metasurface structure without an integrated power amplifier according to an embodiment of the present application, showing four states corresponding to 2 bits.
Figure 16:
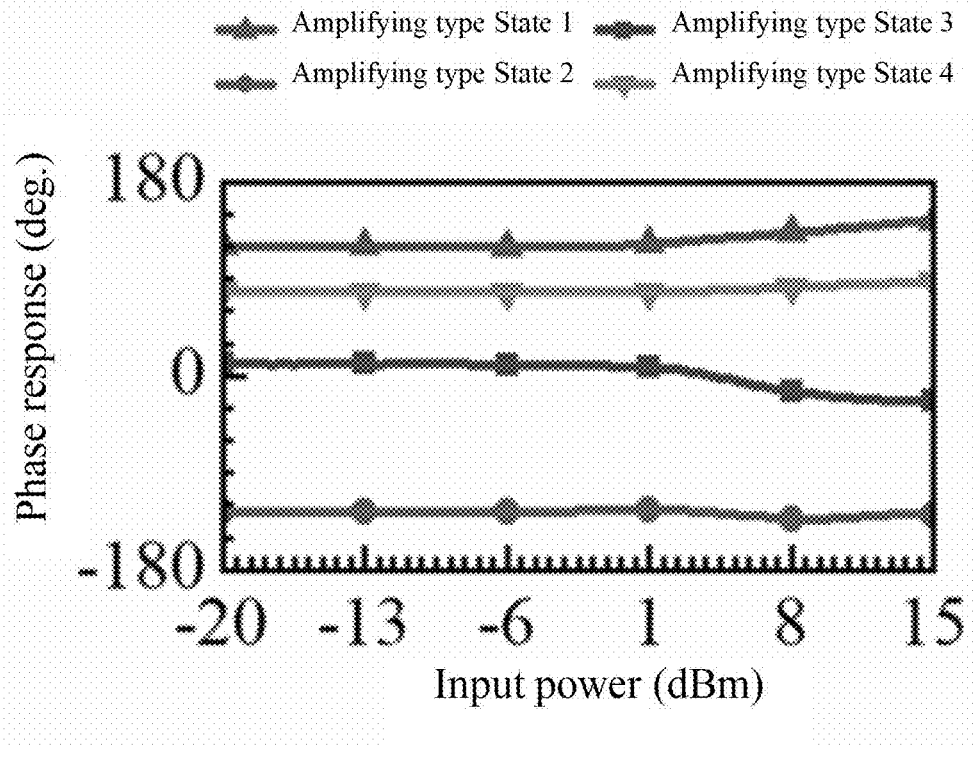
FIG. 16 illustrates the variation curve of the phase response as a function of the input power for the proposed metasurface structure according to an embodiment of the present application, showing four states corresponding to 2 bits.

Furthermore, the amplitude response as a function of the input power was measured for both the proposed structure and the proposed structure without an integrated amplifier, as shown in FIG. 15. It can be observed that compared to the proposed structure without an integrated amplifier, the proposed structure showed an 8.1 dB gain improvement, indicating that the proposed structure possesses excellent power-handling capabilities. The saturated output power of the proposed structure exceeds 27 dBm, indicating an output power intensity of over 147.7 W/m², suitable for high-power spatial microwave transmission. Furthermore, the phase response as a function of the input power was measured for the proposed structure, as shown in FIG. 16. Before the 1 dB output power compression point, the phase variation of the proposed structure was less than 7°, indicating that the structure possesses excellent phase stability in high-power scenarios.

In the present application, a power-amplifying reflective metasurface with adjustable gain and phase has been designed. Firstly, the present application provides a 2-bit high-power amplifying non-reciprocal reflective metasurface, which achieves electromagnetic wave enhancement and enables the electromagnetic wave phase to achieve 2 bits, i.e., enabling regulation and control capabilities for four states. The gain of the electromagnetic wave can also be achieved by adjusting the bias voltage of the amplifier. This design enables more flexible beamforming, improved signal-to-noise ratios in information transmission, and expanded communication area coverage in wireless communications. Secondly, the present application provides a 2-bit high-power amplifying non-reciprocal reflective metasurface, using a design method for magnetless non-reciprocal devices to achieve polarization conversion. That is, in forward transmission, the metasurface enhances electromagnetic waves and enables orthogonal polarization conversion, and in backward transmission, it enables orthogonal polarization conversion but with attenuation. Thirdly, the present application provides a 2-bit high-power amplifying non-reciprocal reflective metasurface, which enhances the power-carrying capacity of conventional digital coding metasurface units, making the digital coding metasurfaces suitable for high-power communication and energy scenarios. Fourthly, the present application provides a 2-bit high-power amplifying non-reciprocal reflective metasurface, which integrates a unilateral power amplifier with the metasurface unit, ensuring stability in the integrated amplification system while reducing the aperture of metasurfaces with non-reciprocal functions. This design increases the integration level of the metasurfaces, facilitating device deployment in wireless communication scenarios.

Compared with the prior art, the 2-bit high-power amplifying non-reciprocal reflective metasurface provided according to the present application has the following advantages: (1) The present application achieves electromagnetic wave amplification by cascading power amplifiers and enables gain control by adjusting the bias voltage. By regulating and controlling the PIN diode states of the reconfigurable receiving metal patch and the PIN diode states of the cascaded phase shifter, the present application achieves the 2-bit phase regulation and control capability for the electromagnetic wave. This metasurface with adjustable amplitude and phase as well as amplifying properties enables more flexible beamforming, improved signal-to-noise ratios in information transmission, and expanded communication area coverage in wireless communications. Additionally, the metasurface can connect to digital control platforms like FPGAs, enabling programmable high-speed beam regulation and control. (2) The present application achieves reflective non-reciprocal transmission of electromagnetic waves in the form of polarization conversion by cascading a unilateral power amplifier and arranging the orientation of the slot on the transmitting metal patch orthogonal to that of the slot on the receiving metal patch. That is, in forward transmission, the present application enhances electromagnetic waves and enables orthogonal polarization conversion, and in backward transmission, it enables orthogonal polarization conversion but with attenuation. A design method for magnetless non-reciprocal devices is provided, which holds application value in wave-form processing and full-duplex transmissions in modern wireless communication systems. (3) In the present application, the integration of phase-controlled metasurface units with power amplifiers enhances the power-carrying capacity of conventional metasurfaces, making the metasurfaces suitable for high-power communication and energy scenarios due to the high tolerance power properties of the amplifiers. (4) In the present application, the integration of unilateral power amplifiers with metasurface units ensures stability in the integrated amplification system while reducing the aperture of the digital metasurfaces with non-reciprocal properties. This design increases the integration level of the metasurfaces, facilitating device deployment in wireless communication scenarios.

It should be noted that the selection of the power amplifier and PIN diodes used in the metasurface structure according to the present application can be replaced by devices of other models. Phase regulation and control can be achieved using alternative phase-shifting materials or devices such as varactors or MEMS switches, besides PIN diodes, and can achieve other forms of phase quantization different from the 2-bit representation. Furthermore, the functionality of the metasurface structure according to the present application can be achieved in other frequency bands by altering the sizes of the metal patches and dielectric substrate material, among other modifications. In addition, an alternative to this integrated design structure involves separating the reconfigurable receiving and transmitting metal patches in the structure into individual units. The same functionality is achieved by providing ports at the receiving and transmitting ends and cascading 90-degree phase shifters and power amplifiers at these ports. Finally, the present application can adopt a structure for the metasurface unit without integrating the power amplifier, enabling non-reciprocal transmission of electromagnetic waves through time modulation encoding.

In summary, a metasurface unit structure integrating a power amplifier and a phase shifter has been designed according to the present application, which ensures stable gain amplification properties while enabling stable phase modulation, i.e., achieving a power-amplifying metasurface unit with adjustable gain and phase. Moreover, a metasurface unit structure with a cascading power amplifier and phase shifter has been designed according to the present application, which achieves reflective non-reciprocal transmission of electromagnetic waves in the form of orthogonal polarization conversion. Furthermore, the metasurface unit structure with a cascading power amplifier and phase shifter designed according to the present application ensures that the phase modulation-based metasurfaces can function properly even in high-power scenarios.

The 2-bit high-power amplifying non-reciprocal reflective metasurface provided according to the present application holds promising application prospects. In recent years, metasurfaces integrated with power amplifiers have been a focal point in research. They enable electromagnetic wave amplification with dynamic gain regulation and control. Compared to a passive metasurface or a metasurface integrated with a lossy device, the proposed metasurface has the following advantages: (1) It achieves positive gain and allows for dynamic gain control by adjusting the bias voltage of the amplifier. (2) Unilateral power amplification enables non-reciprocal transmission of electromagnetic waves.

In the metasurface structure of the present application, the metasurface unit is a power-amplifying metasurface unit with an adjustable phase, which provides advantages over other known power-amplifying metasurface units. These advantages include independent control over electromagnetic wave phases, thereby achieving amplitude-phase adjustable electromagnetic beam control. This provides a design solution for beam forming, signal coverage, and high-power wireless energy transmission in wireless communication.

A 2-bit high-power amplifying non-reciprocal reflective metasurface is provided according to the present application. The phase-adjustable power-amplifying non-reciprocal reflective metasurface is composed of orderly arranged metasurface units. The metasurface holds the following application prospects: (1) It addresses the heat and power tolerance issues brought by lossy elements, as these issues prevent metasurface coding from achieving high-power and wide-range electromagnetic signal coverage. The present application facilitates the creation of a novel wireless communication system architecture with high efficiency, high signal transmission quality, and extensive coverage. (2) Based on the field enhancement reconfigurable and beam reconfigurable properties of the active power amplifier encoded metasurface, research can be conducted on the enhanced blind-spot elimination technology and expanded wireless channel reshaping range of 6G intelligent metasurfaces in wireless communication signals. (3) The present invention can combine with space-time encoded power-amplifying metasurfaces, through information loading, to reduce the downlink radio frequency link modules, thus improving wireless communication system efficiency and reducing manufacturing costs. This holds significant application potential and research value for wireless communication systems, especially in the millimeter-wave and THz frequency bands. (4) The present invention, combined with space-time encoded power-amplifying metasurfaces, possesses high-power and nonlinear harmonic-enhanced beam scanning properties, facilitating research on new radar system configurations. (5) The present invention, merging electromagnetic energy-convergent beams with digital information, utilizes the separation control mode of fundamental and harmonic waves generated by combining with space-time encoded power-amplifying metasurfaces for novel energy-carrying communication system research and design. (6) The present invention holds substantial scientific significance and application value for the exploration in the technical field of novel metamaterial and energy-carrying communication and the development of next-generation wireless communication technology.

Based on the technical solutions mentioned above, a 2-bit high-power amplifying non-reciprocal reflective metasurface is provided according to the embodiments of the present application, which comprises a plurality of metasurface units distributed in an array. Each metasurface unit comprises a first metal layer 101, an intermediate layer 102, and a second metal layer 103 which are sequentially stacked. The second metal layer 103 comprises a receiving metal patch 1031 and a transmitting metal patch 1032. Two diodes are disposed on the receiving metal patch 1031, and the two diodes are both positioned on the longitudinal central axis A of the receiving metal patch 1031. Slots are formed on both the transmitting metal patch 1032 and the receiving metal patch 1031, and the orientation of the slot on the transmitting metal patch 1032 is orthogonal to the orientation of the slot on the receiving metal patch 1031. The first metal layer 101 comprises a phase shifter 1011, which comprises first series diodes and second series diodes. The first series diodes and the second series diodes each comprise two diodes in series, and the first series diodes are connected in parallel at both ends of the second series diodes. The first series diodes and the second series diodes form a reconfigurable 90-degree phase-shift circuit. By adjustment of the states of the diodes on the receiving metal patch 1031 and the states of the first series diodes and the second series diodes in the phase shifter 1011, the electromagnetic wave phase achieves 2 bits, i.e., allowing for four independent regulation and control capabilities. The metasurface unit further comprises a power amplifier 1012 arranged on the first metal layer 101. One end of the power amplifier 1012 is connected to the phase shifter 1011, and the other end is connected to the transmitting metal patch 1032 by plated through-holes.

A 2-bit high-power amplifying non-reciprocal reflective metasurface is provided according to the present application. On the one hand, a metasurface unit structure integrating a power amplifier and a phase shifter has been designed, which ensures stable gain amplification properties while enabling stable phase modulation, i.e., achieving a power-amplifying metasurface unit with adjustable gain and phase. On the other hand, a metasurface unit structure with a cascading power amplifier and phase shifter has been designed, which achieves non-reciprocal reflective transmission of electromagnetic waves in the form of orthogonal polarization conversion. Furthermore, the metasurface unit structure with a cascading power amplifier and phase shifter designed according to the present application ensures that the phase modulation-based metasurfaces can function properly even in high-power scenarios.

Those of ordinary skill in the art can understand that the various embodiments mentioned above represent specific implementations to realize the present application. In practical applications, various alterations can be made in form and detail without departing from the spirit and scope of the present application. Any person skilled in the art can make respective changes and modifications without departing from the spirit and scope of the present application, and the protection scope of the present application is defined by the appended claims.

What is claimed is:

1. A 2-bit high-power amplifying non-reciprocal reflective metasurface, comprising a plurality of metasurface units distributed in an array, wherein each of the plurality of metasurface units comprises a first metal layer, an intermediate layer, and a second metal layer, wherein the first metal layer, the intermediate layer, and the second metal layer are sequentially stacked, wherein the second metal layer comprises a receiving metal patch and a transmitting metal patch; two diodes are disposed on the receiving metal patch, and the two diodes are both positioned on a longitudinal central axis of the receiving metal patch; slots are formed on both the transmitting metal patch and the receiving metal patch, and orientation of the slot on the transmitting metal patch is orthogonal to orientation of the slot on the receiving metal patch;

the first metal layer comprises a phase shifter, wherein the phase shifter comprises first series diodes and second series diodes; the first series diodes and the second series diodes each comprise two diodes in series, and the first series diodes are connected in parallel at both ends of the second series diodes; the first series diodes and the second series diodes form a reconfigurable 90-degree phase-shift circuit; by adjustment of states of the diodes on the receiving metal patch and states of the first series diodes and the second series diodes in the phase shifter, electromagnetic wave phase achieves 2 bits, wherein four independent regulation and control capabilities are allowed;

each of the plurality of metasurface units further comprises a power amplifier arranged on the first metal layer, wherein a first end of the power amplifier is connected to the phase shifter, and a second end of the power amplifier is connected to the transmitting metal patch by plated through-holes.

2. The 2-bit high-power amplifying non-reciprocal reflective metasurface according to claim 1, wherein the intermediate layer comprises a first dielectric layer, a third metal layer, a prepreg, and a second dielectric layer, the first dielectric layer, the third metal layer, the prepreg, and the second dielectric layer are sequentially stacked, wherein for direct current signals, the third metal layer serves as a ground to provide a reference level for a direct current voltage;

for radio frequency signals, the third metal layer serves as a metallic reflective surface to enhance reflection capability for electromagnetic wave signals.

3. The 2-bit high-power amplifying non-reciprocal reflective metasurface according to claim 1, wherein the metasurface unit further comprises a first bias signal line and a second bias signal line arranged on the first metal layer, wherein the first bias signal line is connected to the receiving metal patch by plated through-holes and suppresses a radio frequency signal from the receiving metal patch by using a quarter-wavelength high-impedance line cascading a fan-shaped segment, providing a direct current path for a bias signal;

the second bias signal line is connected to a first end of the phase shifter and suppresses a radio frequency signal from the receiving metal patch by using a quarter-wavelength high-impedance line cascading a fan-shaped segment; a second end of the phase shifter is grounded through inductor $L_1$.

4. The 2-bit high-power amplifying non-reciprocal reflective metasurface according to claim 3, wherein a capacitor $C_0$ is disposed between the receiving metal patch and the phase shifter, and the capacitor $C_0$ is configured to isolate a first bias signal and a second bias signal.

5. The 2-bit high-power amplifying non-reciprocal reflective metasurface according to claim 1, wherein the receiving metal patch and the transmitting metal patch are laid parallel on a surface of the intermediate layer;

the power amplifier is a unilateral power amplifier; the first metal layer integrates with the unilateral power amplifier to amplify electromagnetic wave signals when x-polarized waves enter the metasurface unit in a forward direction; due to the orthogonal orientation of the slots on the receiving metal patch and the transmitting metal patch, reflected waves are converted into y-polarized waves; if y-polarized waves are reversed and incident back onto the metasurface unit, the electromagnetic wave signals are attenuated, and the reflected waves convert into x-polarized waves.

6. The 2-bit high-power amplifying non-reciprocal reflective metasurface according to claim 1, wherein the slots on the receiving metal patch comprise a first slot and a second slot, and the first slot and the second slot are symmetrical along the longitudinal central axis.

7. The 2-bit high-power amplifying non-reciprocal reflective metasurface according to claim 6, wherein the two diodes on the receiving metal patch are positioned between the first slot and the second slot;

a distance between the two diodes is greater than half a length of the first slot in a direction along the longitudinal central axis, and less than the length of the first slot in the direction along the longitudinal central axis.

8. The 2-bit high-power amplifying non-reciprocal reflective metasurface according to claim 6, wherein both the first slot and the second slot are rectangular slots;

a length direction of the rectangular slots is parallel to the longitudinal central axis.

9. The 2-bit high-power amplifying non-reciprocal reflective metasurface according to claim 6, wherein the slot on the transmitting metal patch is a U-shaped slot;

a length direction of the U-shaped slot is perpendicular to a length direction of the first slot or the second slot.

10. The 2-bit high-power amplifying non-reciprocal reflective metasurface according to claim 1, wherein both the first metal layer and the second metal layer are made of copper materials;

the first metal layer and the second metal layer have a same thickness.

* * * * *